United States Patent
Wagner et al.

(10) Patent No.: US 12,038,720 B2
(45) Date of Patent: Jul. 16, 2024

(54) ARRANGEMENT AND METHOD FOR DETECTING A MEASURED VALUE ON THE BASIS OF ELECTRON HOLOGRAPHY

(71) Applicant: Technische Universität Berlin, Berlin (DE)

(72) Inventors: Tolga Wagner, Berlin (DE); Michael Lehmann, Berlin (DE); Tore Niermann, Berlin (DE)

(73) Assignee: Technische Universität Berlin, Berlin (DE)

( * ) Notice: Subject to any disclaimer, the term of this patent is extended or adjusted under 35 U.S.C. 154(b) by 695 days.

(21) Appl. No.: 17/266,581

(22) PCT Filed: Jun. 28, 2019

(86) PCT No.: PCT/EP2019/067425
§ 371 (c)(1),
(2) Date: Feb. 6, 2021

(87) PCT Pub. No.: WO2020/035205
PCT Pub. Date: Feb. 20, 2020

(65) Prior Publication Data
US 2022/0171333 A1    Jun. 2, 2022

(30) Foreign Application Priority Data
Aug. 13, 2018  (EP) .................................... 18188717

(51) Int. Cl.
*G03H 1/00*   (2006.01)
*G03H 1/22*   (2006.01)
*G03H 5/00*   (2006.01)

(52) U.S. Cl.
CPC ............. *G03H 1/22* (2013.01); *G03H 1/0005* (2013.01); *G03H 5/00* (2013.01); *G03H 2001/0033* (2013.01); *G03H 2224/04* (2013.01)

(58) Field of Classification Search
CPC .... G03H 1/0005; G03H 1/22; G03H 2226/11; G03H 2226/02; H01J 37/266
See application file for complete search history.

(56) References Cited

U.S. PATENT DOCUMENTS

| | | |
|---|---|---|
| 3,666,344 A | 5/1972 | Mottier |
| 2003/0016364 A1 | 1/2003 | Thomas et al. |

(Continued)

FOREIGN PATENT DOCUMENTS

| | | |
|---|---|---|
| CN | 1480736 A | 3/2004 |
| CN | 102326049 A | 1/2012 |

(Continued)

OTHER PUBLICATIONS

T. Niermann et al, "Gated interference for time-resolved electron holography" Jun. 19, 2017, Techniche Universitat Berlin, Ultramicroscopy, vol. 182, pp. 54-61. (Year: 2017).*

(Continued)

*Primary Examiner* — David E Smith
*Assistant Examiner* — Hsien C Tsai
(74) *Attorney, Agent, or Firm* — Gordon Rees Scully Mansukhani, LLP

(57) ABSTRACT

The invention relates to a method for detecting a measured value (dϕ/dx, M). According to the invention, provision is made for a sinusoidal excitation signal (Ue) with a predetermined excitation frequency (f), with or without a superposed DC component (Uoffset), to be fed to an input of a component (100, C), for at least one electron holography measuring step to be carried out, in which an electron beam (Continued)

Figure 1:
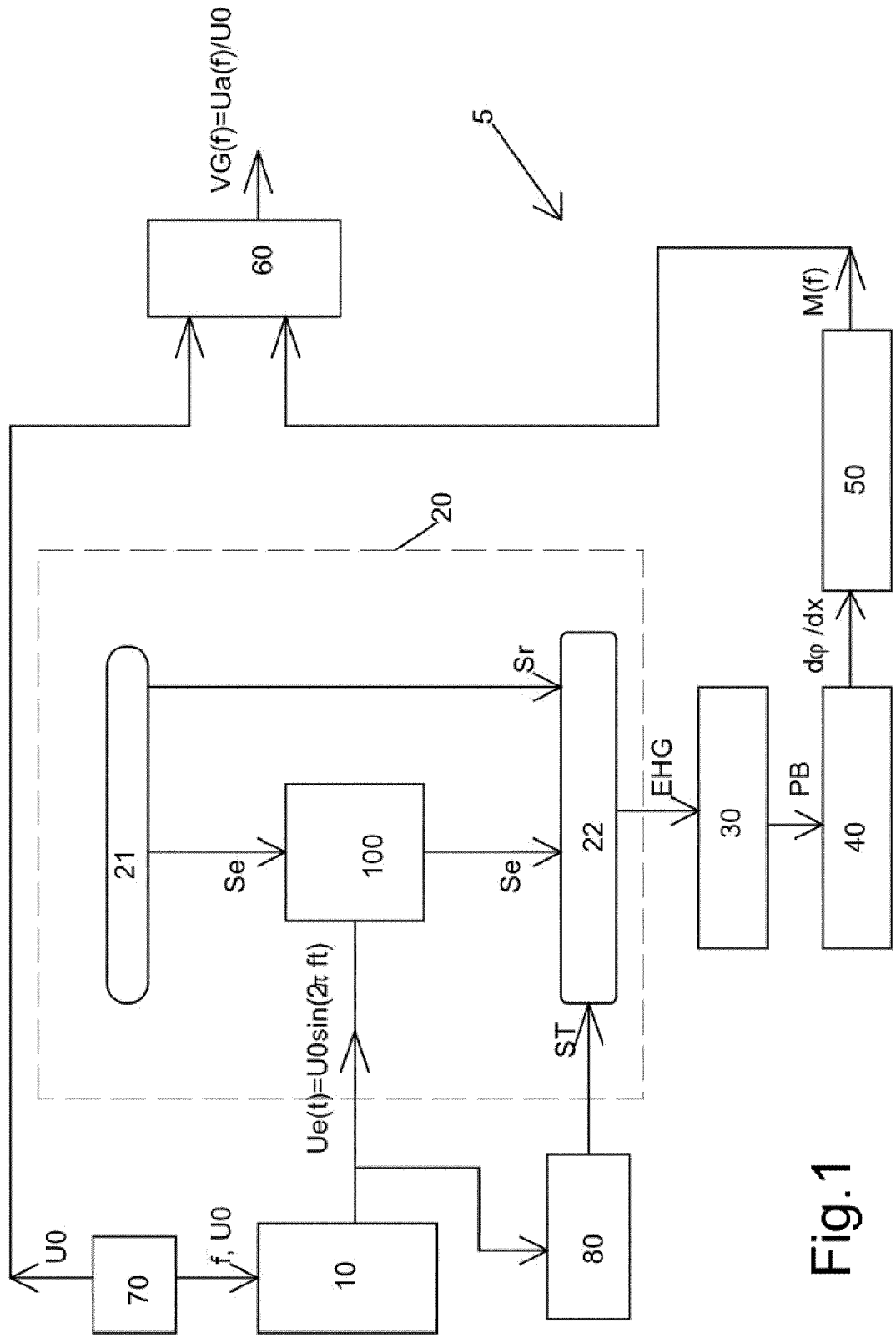

(Se) is directed on the component (100, C), said electron-beam penetrating and/or passing the component (100, C) and subsequently being superposed with a reference electron-beam (Sr), and for an electrical hologram (EHG) arising by interference of the two electron beams (Se, Sr) during a predetermined measurement window (F) to be measured and the phase image (PB) to be ascertained therefrom, and for the measured value (M) to be formed on the basis of the phase image (PB), wherein the temporal length (Tf) of the measurement window (F) of the electron holography measuring step is shorter than half the period (T) of the sinusoidal excitation signal (Uc).

20 Claims, 8 Drawing Sheets

(56) References Cited

U.S. PATENT DOCUMENTS

| | | | |
|---|---|---|---|
| 2004/0027140 A1 | 2/2004 | Fawcett | |
| 2009/0080315 A1* | 3/2009 | Kanamaru | G11B 7/0065 |
| 2014/0177030 A1 | 6/2014 | Dillon et al. | |
| 2014/0340733 A1 | 11/2014 | Dillon et al. | |

FOREIGN PATENT DOCUMENTS

| | | |
|---|---|---|
| CN | 104765263 A | 7/2015 |
| EP | 1 376 142 A1 | 1/2004 |
| JP | 5-323859 A | 12/1993 |
| JP | 2001-042757 A | 2/2001 |
| JP | 2011-186072 A | 9/2011 |

OTHER PUBLICATIONS

V. Migunov et al, "Prospects for Quantitative and Time-Resolved Double and Continuous Exposure Off-Axis Electron Holography", 2017, Techniche Universitat Berlin, Ultramicroscopy, vol. 178, pp. 48-61. (Year: 2017).*

Second Chinese Office Action dated Sep. 15, 2022 issued by the Chinese Patent Office in related Chinese Patent Application No. 201980052227.1.

Chinese Office Action dated Feb. 16, 2022 issued by the Chinese Patent Office in related Chinese Patent Application No. 201980052227.1.

T. Niermann et al.; "Gated Interference for Time-Resolved Electron Holography"; Techniche Universität Berlin; Ultramicroscopy; vol. 182; Jun. 19, 2017; pp. 54-61; XP085204034; ISSN: 0304-3991.

Vadim Migunov et al.; "Prospects for Quantitative and Time-Resolved Double and Continuous Exposure Off-Axis Electron Holography"; Ultramicroscopy; vol. 178 (2017); pp. 48-61; XP085014639; ISSN: 0304-03991.

C. Gatel et al.; "Dynamical Holographic Moires in a TEM"; Journal of Physics D: Applied Physics, Institute of Physics Publishing Ltd.; vol. 49; No. 32; Jul. 19, 2016; p. 324001, XP020307499; ISSN: 0022-3727.

Tolga Wagner et al.; "Towards High-Frequency Electrical Specimen Stimulation for Time-Resolved Electron Microscopy"; Technische Universität Berlin; 2 pages.

European Search Report dated Jan. 25, 2019 issued in related European Patent Application No. 18188717.5.; filed Aug. 13, 2018.

International Search Report and Written Opinion dated Oct. 17, 2019 issued on related International Patent Application No. PCT/EP2019/067425; Filed Jun. 28, 2019.

* cited by examiner

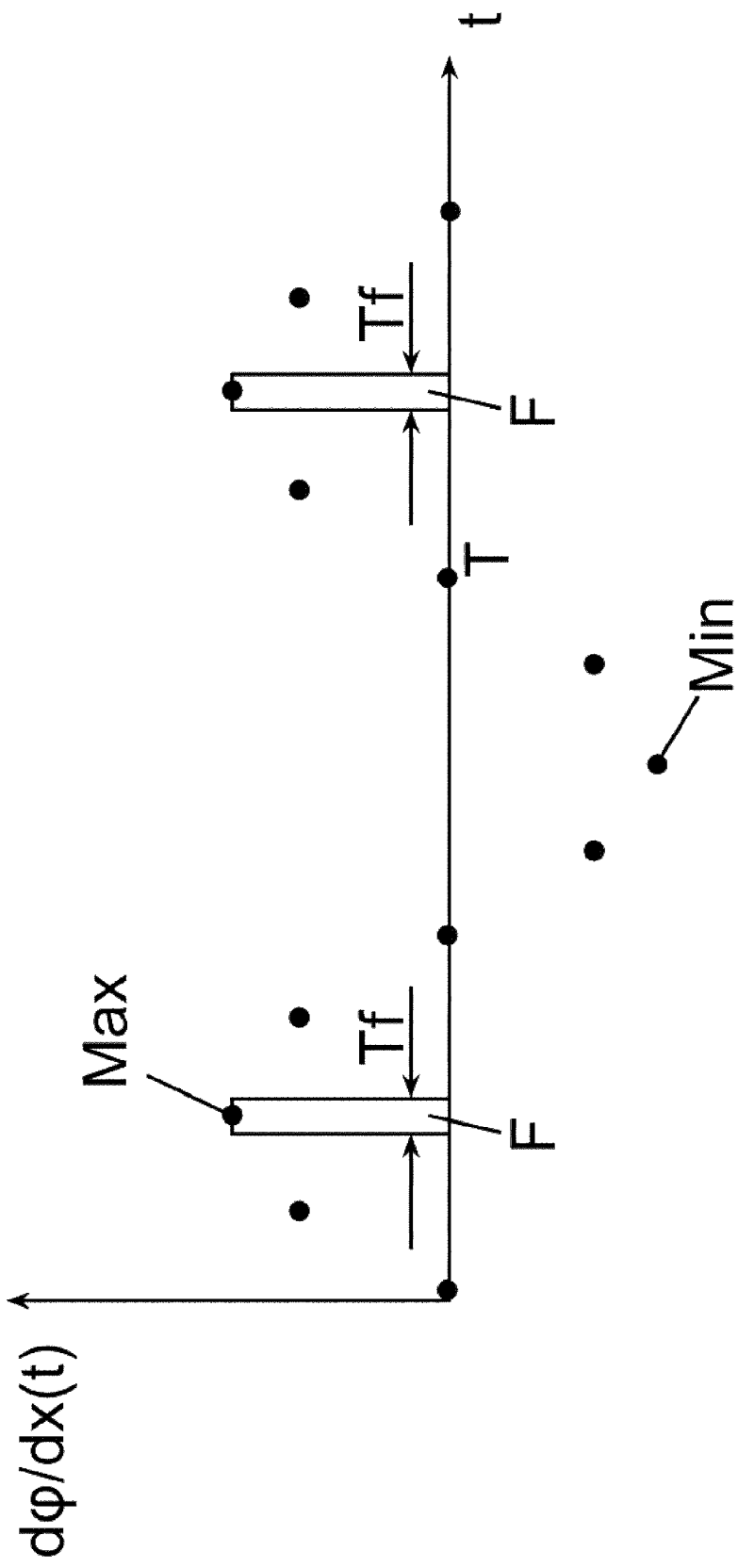

ARRANGEMENT AND METHOD FOR DETECTING A MEASURED VALUE ON THE BASIS OF ELECTRON HOLOGRAPHY

The invention relates to a method for recording a measurement value with the inclusion of at least one electron holography measurement step.

The document "Gated interference for time-resolved electron holography" (T. Niermann, M. Lehmann, and T. Wagner, Ultramicroscopy 182 (2017) 54-61) discloses a time-resolved electron holography measurement method in which a square-wave excitation signal is fed to an input of a component. An electron hologram formed by interference between two electron beams during a predetermined measurement window is measured and a phase image is determined therefrom; an measurement value is formed with the aid of the phase image.

The document "Prospects for quantitative and time-resolved double and continuous exposure off-axis electron holography" (V. Migunov et al., Ultramicroscopy 178 (2016) 48-61) discloses a non-time-resolved electron holography measurement method in which a measurement window has a temporal length in the second range and leads to averaging over millions of periods of the excitation signal.

The object of the invention is to provide a measurement method which can deliver measurement values in a relatively straightforward way even for very small components which are only limitedly accessible.

This object is achieved according to the invention by a method having the features of patent claim 1. Advantageous configurations of the method according to the invention are specified in the dependent claims.

According to the invention, therefore, a sinusoidal excitation signal having a predetermined excitation frequency, with or without a superimposed DC part, is fed to an input of a component, at least one electron holography measurement step is carried out, in which an electron beam is directed onto the component, passes through the component and is subsequently superimposed with a reference electron beam, and an electron hologram resulting from interference of the two electron beams during a predetermined measurement window is measured and a phase image is determined therefrom, and the measurement value is formed with the aid of the phase image, wherein the temporal length of the measurement window of the electron holography measurement step is less than half the period duration of the sinusoidal excitation signal.

One substantial advantage of the method according to the invention is that the temporal length of the electron holography measurement step, or the temporal length of the measurement windows, is respectively adapted in each electron holography measurement step to the period duration of the sinusoidal excitation signal, specifically in such a way that the measurement window length is always less than half the period duration. The effect achievable by this dimensioning of the measurement window length is that the phase image may always be used to form the measurement value, for example by quantitatively evaluating the variation of the phase as a function of the position.

A further substantial advantage of the method according to the invention is that the method makes it possible to measure electrical or magnetic field strengths, electrical voltages or electrical currents, even for very small components which can be externally accessed only with difficulty and which, for example, cannot themselves be contacted.

It is advantageous for the location of the measurement window relative to the points of maximum gradient of the excitation signal to be selected in such a way that the measurement window lies between these points and does not include them. In this configuration, particularly unperturbed phase images, which can be evaluated particularly easily, may be achieved.

If a sinusoidal excitation signal without a superimposed DC part is fed into the component, it is therefore advantageous for the location of the measurement window relative to the zero crossings to be selected in such a way that the measurement window lies between the zero crossings and does not include them.

It is particularly advantageous for the location of the measurement window to be selected in such a way that it records an extremum, i.e. either a maximum or a minimum, of the excitation signal. In the regions of an extremum, the excitation signal is relatively constant as a function of time and therefore allows particularly accurate measurement results.

The location of the measurement window is preferably selected in such a way that the window center lies at or at least in the region of the extremum of the excitation signal.

With a view to characterization of the component for different frequencies, particularly for determining a frequency response of the component, it is regarded as advantageous for at least two electron holography measurement steps of the type described to be carried out successively with different excitation frequencies.

In the latter variant, it is advantageous that, in each of the electron holography measurement steps, the length of the measurement window and the respective period length of the sinusoidal excitation signal are adapted to one another, specifically in such a way that the ratio between the length of the measurement window and the respective period length of the excitation signal is equally large for all electron holography measurement steps.

It is also advantageous that, in each of the electron holography measurement steps—independently of the respective excitation frequency—the location of the measurement window in relation to the time profile of the excitation signal is always the same. Preferably, the window center always lies at or at least in the region of the selected extremum of the excitation signal.

It is also regarded as advantageous that the variation of the phase as a function of the position is determined by forming a gradient value (i.e. by differentiating the phase with respect to the position) with the aid of the phase image, and the gradient value is output as the measurement value or the measurement value is formed with the gradient value, in particular by multiplication by a constant.

The electrical voltage applied to the component or the current flowing through the component is preferably determined as the measurement value. As an alternative or in addition, field strengths of electric or magnetic fields may be measured.

Any desired objects may be measured as components. It is, however, clearly advantageous for components which respond to an excitation signal, in particular an electrical excitation signal, and which vary a property to a measurable extent as a function of the excitation signal, to be measured or characterized. For example, capacitances, electronic components, cables, electrical instruments, electrochemical cells as components may thus be measured and characterized by measurement values.

The temporal length of the measurement window is preferably less than one fifth of the period duration of the excitation signal, in particular less than one eighth, preferably less than one tenth and particularly preferably less than one twentieth of the period duration of the sine signal. The shorter the length of the measurement window, the more constant the excitation signal in the measurement window is, but the phase image is always more coarse-grained because of the shortness of the measurement time and the evaluability is worsened. The range between ⅕ and ¹⁄₁₀₀ of the period duration of the sine signal therefore represents an optimum for the temporal length of the measurement window.

With respect to the determination of a frequency response, it is regarded as advantageous that a multiplicity of electron holography measurement steps of the type described are carried out successively with different excitation frequencies and, in each electron holography measurement step, a ratio value between the amplitude of the sinusoidal excitation signal and the measurement value is calculated in each case and a frequency response of the component is determined with the aid of the ratio values.

As an alternative, it is advantageous for the location of the measurement window, in particular the location of the window center, relative to the points of maximum variation of the phase to be selected in such a way that the measurement window lies at or at least in the region of these points.

The invention furthermore relates to an arrangement for recording a measurement value. According to the invention, the arrangement comprises:

a sine generator which can generate a sinusoidal excitation signal having a predetermined excitation frequency, with or without a superimposed DC part, and feed it into a component, an electron holography measuring instrument for carrying out an electron holography measurement step, in which
an electron beam is directed onto the component, passes through the component and is subsequently superimposed with a reference electron beam, and
an electron hologram resulting from interference of the two electron beams during a predetermined measurement window is measured and a phase image is determined therefrom, an evaluation unit for forming the measurement value with the aid of the phase image, and a measurement window control unit, which is configured in such a way that it determines the location and length of the measurement window, specifically in such a way that the temporal length of the measurement window of the electron holography measurement step is less than half the period duration of the sinusoidal excitation signal.

With respect to the advantages of the arrangement according to the invention, reference is made to the embodiments above in connection with the method according to the invention.

The measurement window control unit is preferably configured in such a way that it
selects the location of the measurement window relative to the points of maximum gradient of the excitation signal in such a way that the measurement window lies between these points and does not include them, and/or
selects the location of the measurement window in such a way that the measurement window records an extremum, i.e. either a maximum or a minimum, of the excitation signal, and/or
selects the location of the measurement window in such a way that the window center lies at or at least in the region of an extremum of the excitation signal, and/or
selects the location of the measurement window in such a way that the measurement window lies at a plurality of equidistant points, at least four equidistant points, of the excitation signal in order to successively carry out a plurality of, at least four, electron holography measurement steps with equal period lengths of the excitation signal, and/or in the case of a plurality of electron holography measurement steps successively with different period lengths of the excitation signal, in each electron holography measurement step the length of the measurement window is respectively adapted to the respective period length of the excitation signal, specifically in such a way that the ratio between the length of the measurement window and the respective period length of the excitation signal is equally large for all electron holography measurement steps, and/or in the case of a plurality of electron holography measurement steps successively with different period lengths of the excitation signal, in each electron holography measurement step the location of the measurement window is respectively adapted to the respective period length of the excitation signal, specifically in such a way that the location of the measurement window in relation to the time profile of the excitation signal, in particular relative to the extrema of the excitation signal, is the same for all electron holography measurement steps.

The evaluation unit is preferably configured in such a way that it determines the variation of the phase as a function of the position by forming a gradient value with the aid of the phase image, and outputs the gradient value as the measurement value or forms the measurement value with the gradient value, in particular by multiplication by a constant.

A sorting unit of the arrangement is preferably configured in such a way that it sorts gradient values according to the gradient value with the greatest magnitude and forms the measurement value with this gradient value with the greatest magnitude, in particular by multiplication by a constant.

Figure 2:
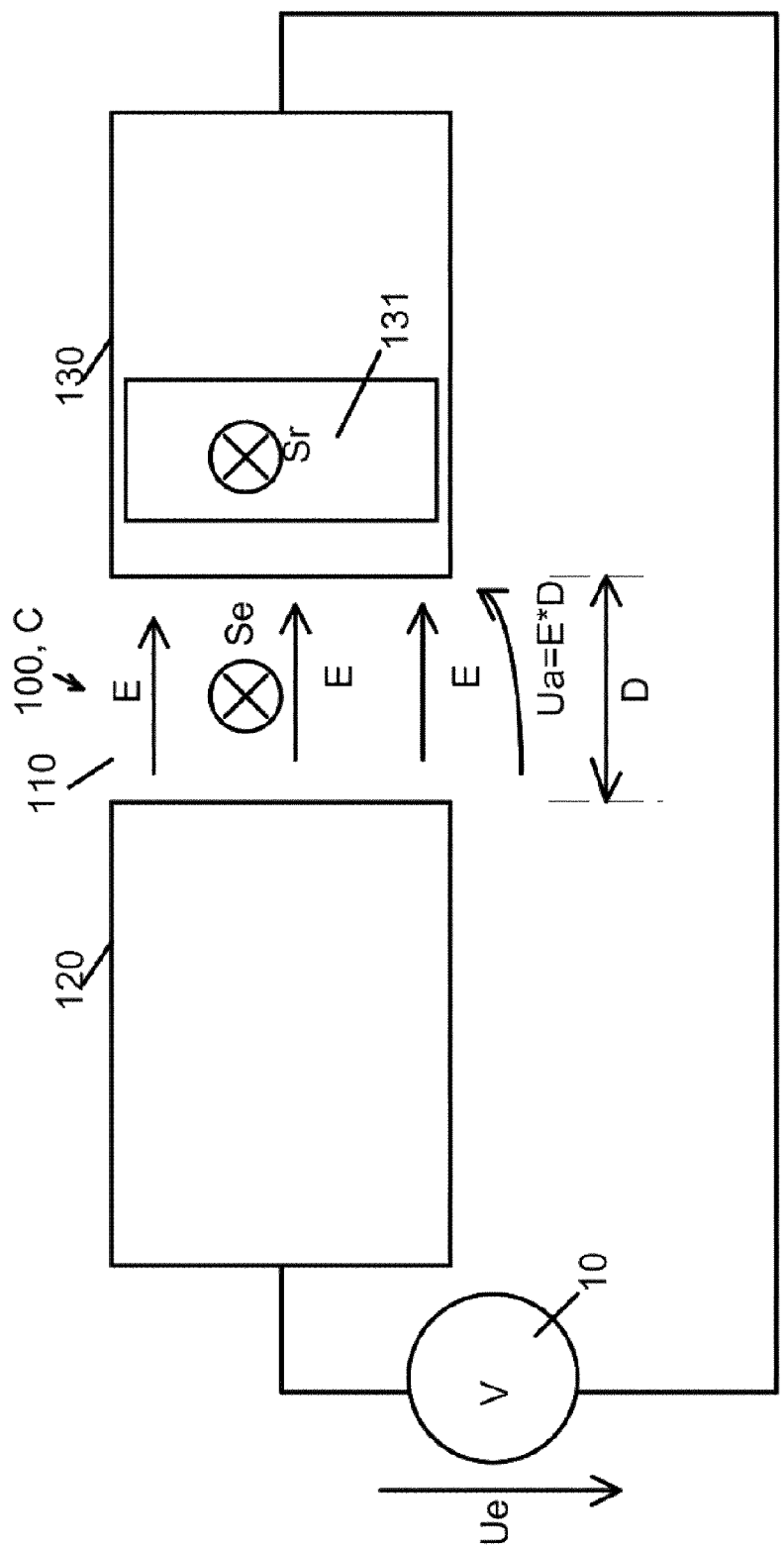
Figure 5:
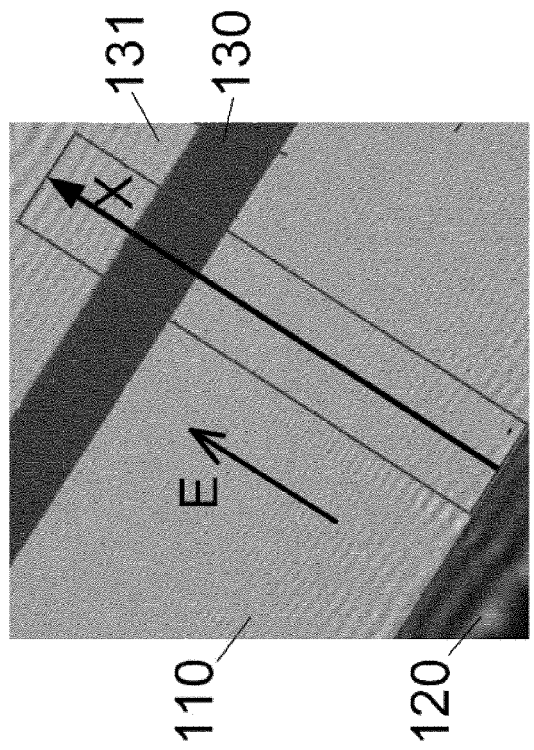
Figure 3:
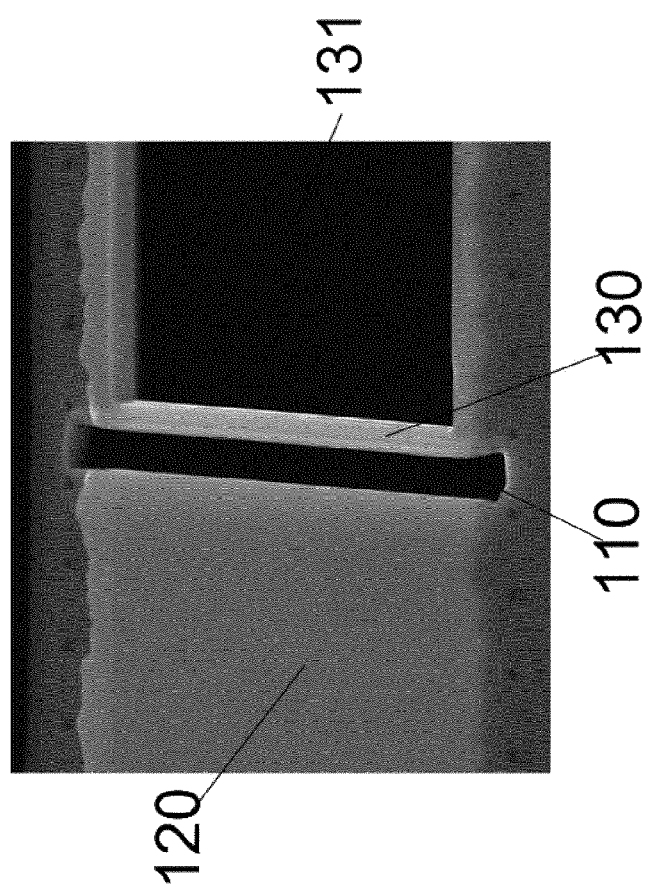
Figure 4:
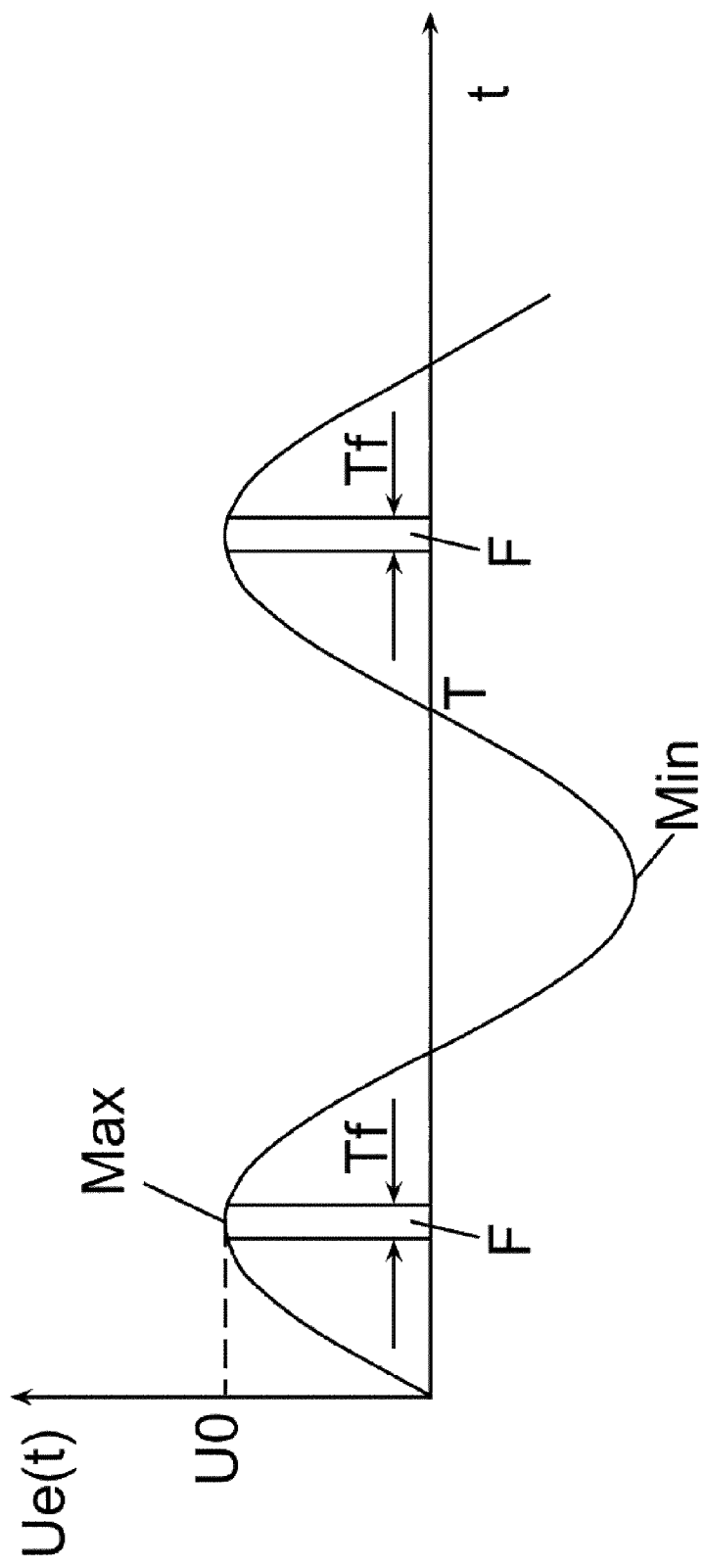
Figure 7:
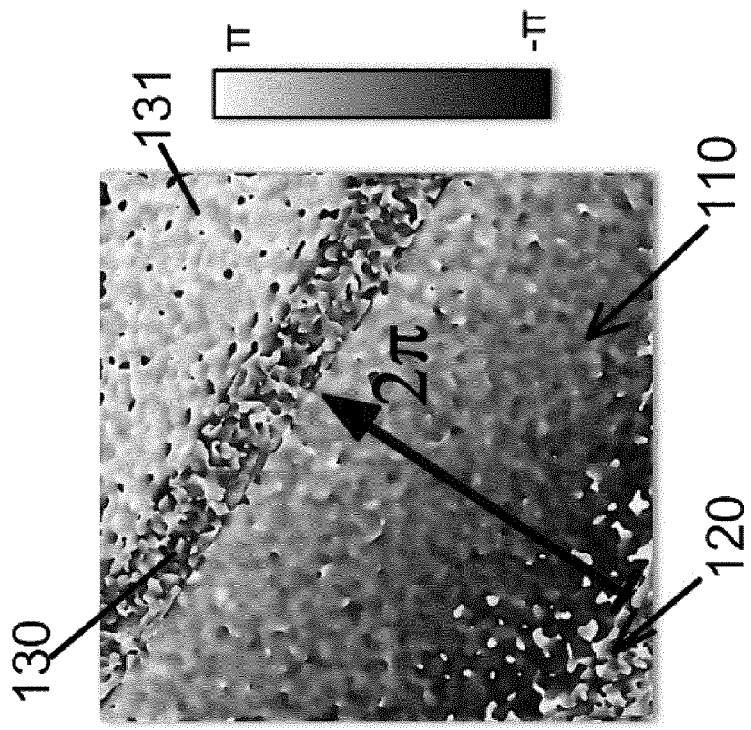
Figure 6:
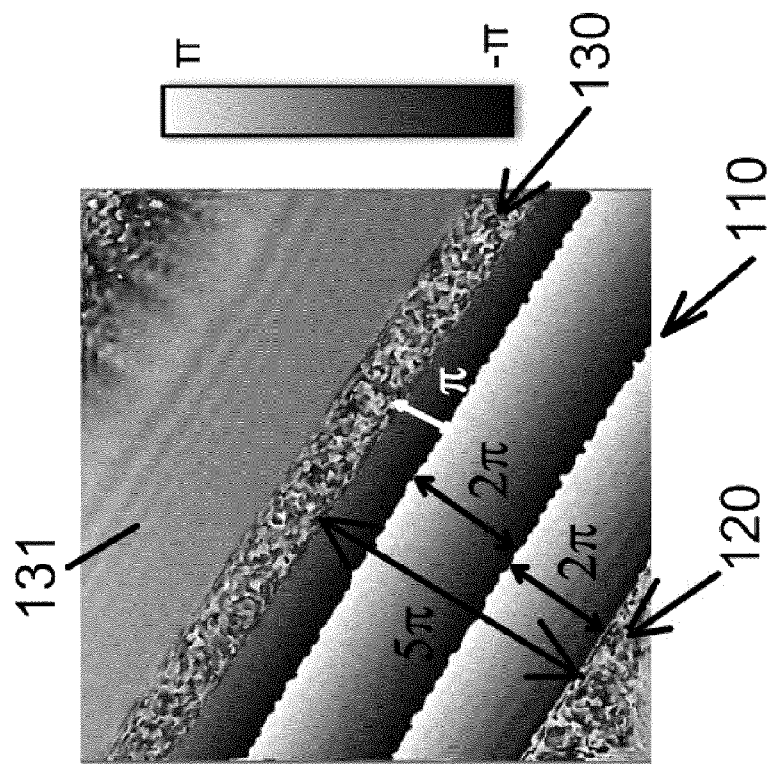
Figure 8:
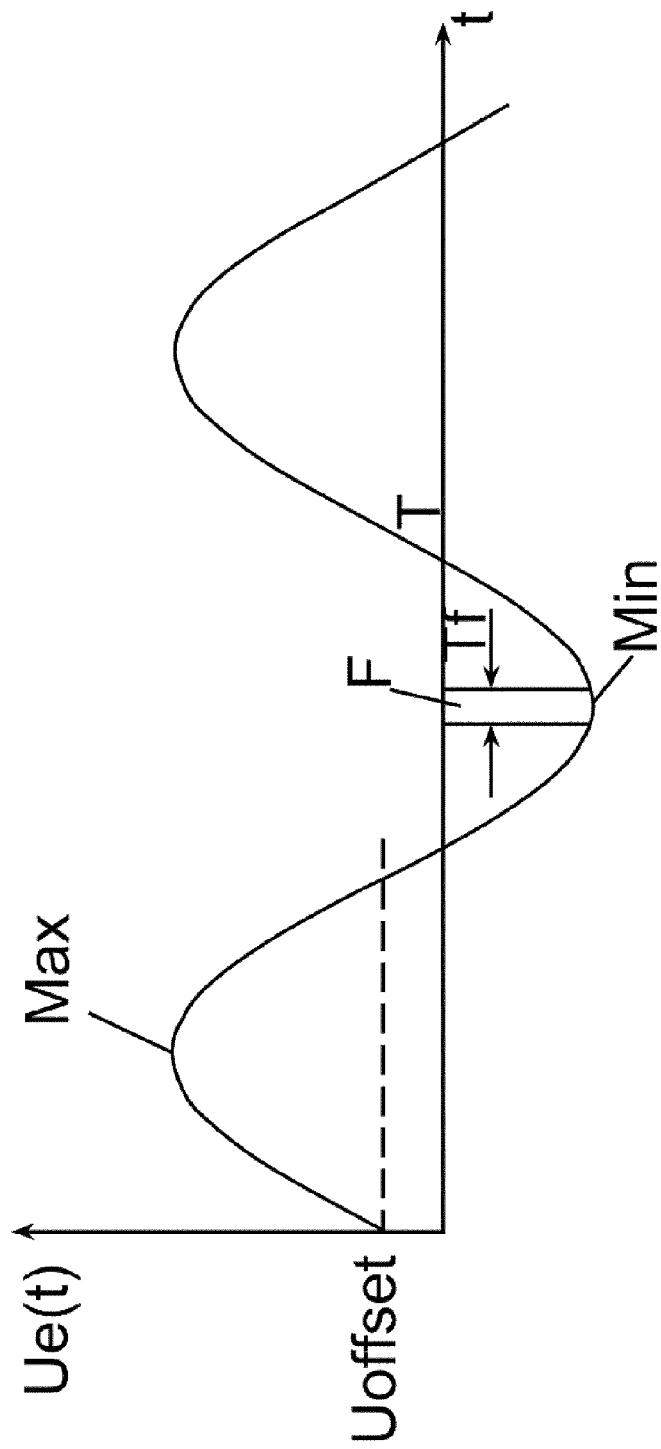
Figure 9:
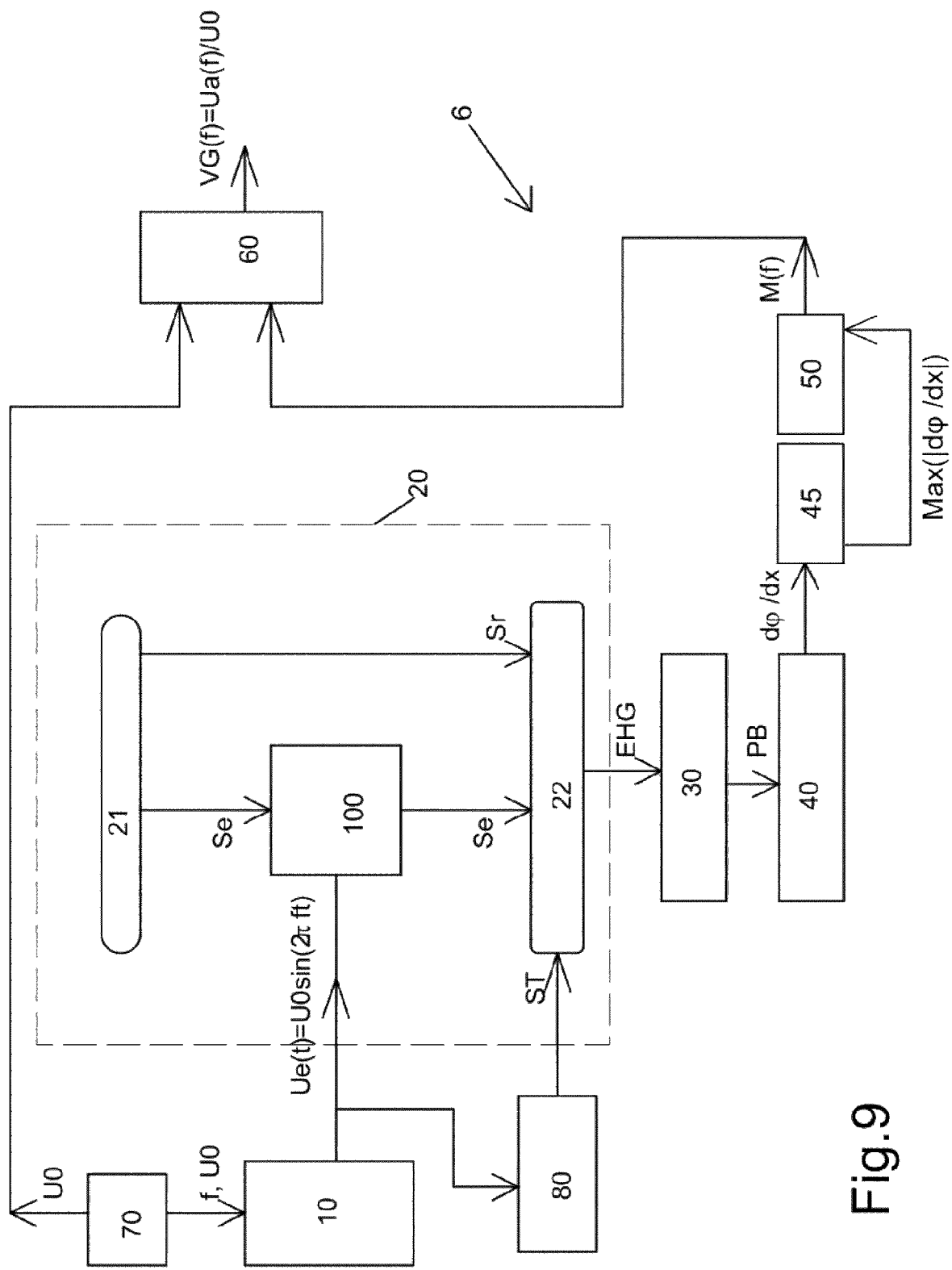

The invention will be explained in more detail below with the aid of exemplary embodiments; by way of example:

FIG. 1 shows an exemplary embodiment of an arrangement according to the invention for recording a measurement value, FIG. 2 shows an exemplary embodiment of a component to which a voltage, the level of which can be measured with the arrangement according to FIG. 1, is applied, FIG. 3 shows an electron microscopy image of the component according to FIG. 2, FIG. 4 shows an exemplary embodiment of an excitation signal which can be generated by a sine generator of the arrangement according to FIG. 1, FIG. 5 shows an exemplary embodiment of an electron hologram which has been generated by an electron holography measuring instrument of the arrangement according to FIG. 1 for the component according to FIGS. 2 and 3, specifically for an excitation frequency of 1 kHz, FIG. 6 shows an exemplary embodiment of a phase image reconstructed from the electron hologram according to FIG. 5, with the aid of which a measurement value, here a measurement value of the component voltage applied to the component according to FIGS. 2 and 3 with an excitation frequency of 1 kHz, has been determined, FIG. 7 shows a phase image reconstructed from an electron hologram with an excitation frequency of 3 MHz, with the aid of which a measurement value of the component voltage applied to the component according to FIGS. 2 and 3 with this excitation frequency has been determined, and FIG. 8 shows a further exemplary embodiment of an excitation signal which can be generated by a sine generator of the arrangement according to FIG. 1, FIG. 9 shows an exemplary embodiment of an alternative arrangement according to the invention for recording a measurement value, FIG. 10 shows an exemplary embodiment of the analysis of the gradient values with equidistant measurement window positions for determination of the gradient value with the greatest magnitude by a sorting unit of the arrangement according to FIG. 9.

In the figures, the same references are always used for identical or similar components for the sake of clarity.

FIG. 1 shows an exemplary embodiment of an arrangement 5 for recording a measurement value. The arrangement 5 comprises a sine generator 10, which generates a sinusoidal electrical excitation signal Ue according to $$Ue(t)=U0\ sin(2\pi ft),$$

where U0 denotes the signal amplitude of the excitation signal, f denotes the excitation frequency of the excitation signal and t denotes the time.

The sinusoidal excitation signal Ue is applied to a component 100. The component 100 is located in an electron holography measuring instrument 20, which inter alia comprises an electron source 21 and a measurement unit 22. The electron holography measuring instrument 20 may, for example, be the instrument described in the document "Gated interference for time-resolved electron holography" (T. Niermann, M. Lehmann, and T. Wagner, Ultramicroscopy 182 (2017) 54-61).

The electron source 21 generates an electron beam Se, which passes through the component 100 and is subsequently superimposed with a reference electron beam Sr. The electron beams interfere and form an electron hologram EHG, which is measured by the measurement unit 22 of the electron holography measuring instrument 20 and is output on the output side. The measurement unit 22 may for example, as described in the aforementioned document "Gated interference for time-resolved electron holography", be a biprism; as an alternative, any other means with which a temporally limited measurement window can be generated may be used, for example a sufficiently rapidly operating camera, a stroboscope device or a beam shadowing device (shutter).

A phase image generating unit 30, which reconstructs a phase image PB from the electron hologram EHG and outputs it on the output side to a downstream evaluation unit 40, is connected to the measurement unit 22 of the electron holography measuring instrument 20. With the aid of the phase image PB, the evaluation unit 40 can determine the variation of phase φ as a function of the position x by forming a gradient value dφ/dx. This gradient value dφ/dx may be output directly as a measurement value of the arrangement 5 or instead—as shown by way of example in FIG. 1—be fed into a downstream multiplier 50, which multiplies the gradient value dφ/dx by a constant K and by this multiplication generates a measurement value M which indicates the component voltage Ua applied to the component 100.

The measurement value M, or the component voltage Ua, which is generally dependent on the frequency f of the excitation signal Ue, is sent to a downstream divider 60 which can determine a frequency response VG(f) of the component 100.

The arrangement 5 furthermore comprises a control device 70, which drives the sine generator 10 and specifies the signal amplitude U0 and the excitation frequency f for carrying out each electron holography measurement step.

The sine generator 10 thus generates the excitation signal Ue while taking into account the specifications received from the control device 70.

In order to drive the measurement unit 22 of the electron holography measuring instrument 20, the arrangement 5 comprises a measurement window control unit 80 which sets the temporal length Tf of the measurement window F (cf. FIG. 4) as well as the temporal location of the measurement window F relative to the time profile of the excitation signal Ue. This setting will be explained in more detail by way of example below in connection with FIG. 4.

An exemplary embodiment of the component 100 according to FIG. 1 is shown in more detail in a schematic plan view in FIG. 2. The component 100 is a capacitance C, which is formed by a gap 110 between a conductive track 120 on the left in FIG. 2 and a conductive track 130 on the right in FIG. 2. The sine generator 10 according to FIG. 1 is connected to the two conductive tracks 120 and 130 and applies the excitation signal Ue to the series circuit consisting of the two conductive tracks 120 and 130 and the capacitance C.

In order to measure the voltage at the capacitance C, the electron beam Se is sent through the gap 110 between the two conductive tracks 120 and 130, so that it is exposed to the electric field E or the electrical potential between the two conductive tracks 120 and 130. The component voltage decreasing at the gap 110 and therefore at the capacitance C is denoted by the reference Ua and is given as follows:

$$Ua=E*D,$$

where D denotes the width of the gap 110.

In order to ensure that the reference electron beam Sr can pass unperturbed through the component 100, or the capacitance C, and not be influenced by the field E applied there, the conductive track 130 on the right in FIG. 2 is provided with an opening 131 which allows unperturbed passage of the reference electron beam Sr.

FIG. 3 shows the two conductive tracks 120 and 130 and the gap 110 located between them in the form of an image which was generated by an electron microscope. The gap width D of the gap 110 may, for example, be 3 μm.

The arrangement 5 according to FIG. 1 may, for example, be described as follows:

The sine generator 10 generates the excitation signal Ue on the output side and feeds it into the component 100. The amplitude U0 and the frequency f of the excitation signal Ue are specified by the control device 70. For each electron holography measurement step, a frequency f may respectively be specified individually; during a measurement with a plurality of electron holography measurement steps, a different excitation frequency f may thus respectively be adjusted for each step, and a frequency response VG(f) of a component may thus for example be measured.

Because of the excitation signal Ue, the electric field E, which influences the electron beam Se, is created in the gap 110 between the conductive tracks 120 and 130; the reference electron beam Sr remains uninfluenced by this field.

The measurement unit 22 of the electron holography measuring instrument 20 is driven by the measurement window control unit 80, specifically in such a way that the location of each measurement window F during each electron holography measurement step is adapted to the respective excitation frequency f of the excitation signal Ue. To this end, on the output side, the measurement window control unit 80 generates a control signal ST which sets the temporal length Tf and the temporal location of the measurement window F relative to the time profile of the excitation signal Ue. This will be explained in more detail below in connection with FIG. 4. The term measurement window is intended here to mean any time interval in which an electron hologram EHG is respectively recorded.

FIG. 4 shows an exemplary embodiment of an excitation signal Ue which may be generated by the sine generator 10 in order to drive the component 100. It may be seen that the measurement window control unit 80 selects the temporal length Tf of the measurement window F to be small in such a way that it is always less than half the period duration T of the excitation signal Ue. It is particularly advantageous for the length Tf of the measurement window F to be at most 5% of the period duration T of the excitation signal Ue and for the location of the measurement window—in relation to the selected extremum (maximum or minimum) respectively to be the same for each electron holography measurement step.

Furthermore, the measurement window control unit 80 ensures that the location of the measurement window F is selected in such a way that the measurement window F lies in the region of an extremum of the excitation signal Ue. In the exemplary embodiment according to FIG. 4, the measurement window F lies in the region of a maximum Max of the excitation signal Ue. It is particularly advantageous for the window center of the window F to coincide with the selected extremum, i.e. the maximum Max in the exemplary embodiment according to FIG. 4.

The selection of the maximum Max as the extremum is only to be understood as exemplary in the exemplary embodiment according to FIG. 4; instead of the maximum, the measurement window F may also lie in the region of a minimum Min of the excitation signal Ue, as explained below in connection with FIG. 8. Also, the excitation signal Ue need not necessarily be only sinusoidal, and instead a DC part may also be superimposed; this will also be explained below in connection with FIG. 8.

FIG. 5 shows an exemplary embodiment of an electron hologram EHG which is recorded by the measurement unit 22 of the electron holography measuring instrument 20. FIG. 5 shows the two conductive tracks 120 and 130, the gap 110 between the conductive tracks, and furthermore the opening 131 in the conductive track 130, in a plan view. The arrow indicating the X coordinate in FIG. 5 thus extends from the conductive track 120 through the gap 110 and into the region of the opening 131 of the conductive track 130.

The electron hologram EHG is evaluated by the phase image generating unit 30 according to FIG. 1 and a phase image PB is extracted, which is shown in more detail in FIG. 6 for an amplitude U0 of the excitation signal Ue of for example 0.5 V. It may be seen that two and a half phase jumps occur in the gap 110, i.e. a phase shift of in total 5 π occurs between the two conductive tracks 120 and 130.

The evaluation unit 40 may now, while taking into account the gap width D of 3 μm between the two conductive tracks 120 and 130, determine the variation of the phase as a function of the position by forming a gradient value dφ/dx, specifically according to:

$$d\varphi/dx = 5\pi/D = 5.2 \text{ rad}/\mu m.$$

The gradient value dφ/dx may be output directly as a measurement value of the arrangement 5. As an alternative or in addition—as in the exemplary embodiment according to FIG. 1—the gradient value dφ/dx may be forwarded to the multiplier 50, which multiplies the gradient value dφ/dx by a constant K determined for the electron holography measuring instrument 20 and, on the output side, generates a measurement value, the component voltage Ua applied to the capacitance C according to FIG. 2, calculated according to $$Ua = K*d\varphi/dx.$$

The constant K may, for example, be determined by using reference measurements with other measuring devices. For example, the voltage at the capacitance C may be measured beforehand or afterward with another conventional measuring instrument, and the measurement result may subsequently be used to calibrate the electron holography measuring instrument 20 or to determine the constant K.

For the phase images shown in FIGS. 6 and 7, an electron holography measuring instrument 20 in which the constant K is 0.0962 Vμm/rad was used, so that a component voltage Ua of 0.5 V is obtained from the above gradient value dφ/dx of 5.2 rad/μm.

In the manner described, a multiplicity of electron holography measurement steps may be carried out for different excitation frequencies f, which are specified by the control device 70.

In the exemplary embodiment according to FIGS. 2 and 3, the capacitance C forms a lowpass filter with the conductive tracks 120 and 130, so that the component voltage Ua applied to the capacitance C is frequency-dependent and decreases with higher frequencies. In this case:

$$Ua = Ue/(2\pi fRC),$$

where R denotes the resistance of the two conductive tracks 120 and 130 and C denotes the capacitance.

Thus, if the excitation frequency f in the excitation signal Ue is increased, the component voltage Ua at the capacitance C will decrease. This fact may be seen in FIG. 7, in which the phase image is represented for a measurement with a higher excitation frequency f of 3 MHz. It may be seen that the phase difference φ between the conductive tracks 120 and 130 is only 2 π, i.e. the voltage Ua at the capacitance C is less by the factor 2.5 than with the excitation frequency of 1 kHz according to FIG. 6.

In the representation according to FIG. 7, the representation of the phase image PB is very much more coarse-grained than in the representation according to FIG. 6, which is related to the fact that the excitation frequency f of the excitation signal Ue is much greater for the electron holography measurement step according to FIG. 7 than for the electron holography measurement step according to FIG. 6, and the temporal length of the measurement window Tf is therefore much less than for the measurement step according to FIG. 6. In fact, it is regarded as particularly advantageous that, in the case of a plurality of electron holography measurement steps successively with different period lengths T of the excitation signal Ue, the temporal length Tf of the measurement window F is respectively adapted to the respective period length T of the excitation signal Ue, specifically in such a way that the ratio Tf/T between the length Tf of the measurement window F and the respective period length T of the excitation signal Ue is equally large for all electron holography measurement steps. For each electron holography measurement step, the location of the measurement window—in relation to the maximum or minimum of the sinusoidal excitation signal—is also preferably respectively equal; particularly preferably, the window center of each measurement window lies precisely at the selected extremum (maximum or minimum) of the excitation signal for all electron holography measurement steps.

By carrying out a plurality of electron holography measurement steps successively with different excitation frequencies f, the frequency response VG(f) for the voltage Ua at the capacitance C may therefore be given according to $$V(f)=Ua(f)/U0.$$

For further explanation, FIG. 8 shows yet another exemplary embodiment of an excitation signal Ue, which may be generated in order to excite the component 100 while carrying out the measurement by means of the arrangement 5 according to FIG. 1. It may be seen that the excitation signal is sinusoidal but is offset by a DC part Uoffset.

FIG. 8 furthermore shows that the measurement window control unit 80 need not necessarily place the measurement window F in the region of the maximum Max, but may also as an alternative place the measurement window F for example in the region of the minimum Min of the excitation signal Ue. Again, it is advantageous here for the window center to lie exactly at the extremum (i.e. the minimum here) for all electron holography measurement steps, independently of the excitation frequency.

FIG. 9 shows an exemplary embodiment of an alternative arrangement 6 for recording a measurement value. The alternative arrangement 6 represents a variant of the arrangement 5 according to FIG. 1, which differs from the arrangement 5 in two aspects.

The measurement window control unit 80 selects the location of the measurement window F in such a way that the measurement window lies at a plurality of equidistant points, at least four equidistant points, of the excitation signal in order to successively carry out a plurality of, at least four, electron holography measurement steps with equal period lengths of the excitation signal. This will be explained in more detail below in connection with FIG. 10.

The electron holograms EHG generated in this way are reconstructed in phase images PB by the phase imaging unit 30, and gradient values dφ/dx are determined with the evaluation unit 40.

FIG. 10 shows an exemplary embodiment of an analysis of the gradient values dφ/dx for equidistant measurement window positions for determination of the gradient value Max|dφ/dx| with the greatest magnitude by a sorting unit 45.

The sorting unit 45 analyses the gradient values dφ/dx determined for equidistant measurement window positions, and determines the gradient value Max|dφ/dx| with the greatest magnitude.

The gradient value Max|dφ/dx| with the greatest magnitude may be output directly as a measurement value of the arrangement 6. As an alternative or in addition—as in the exemplary embodiment according to FIG. 9—the gradient value Max|dφ/dx| with the greatest magnitude may be forwarded to the multiplier 50.

In other regards, reference is made to the explanations above in connection with FIGS. 1 to 10 in relation to the mode of operation of the measurement window control unit 80.

Although the invention has been illustrated and described in more detail by preferred exemplary embodiments, the invention is not restricted by the examples disclosed, and other variants may be derived therefrom by the person skilled in the art without departing from the protective scope of the invention.

LIST OF REFERENCES 5 arrangement
6 alternative arrangement
10 sine generator
20 electron holography measuring instrument
21 electron source
22 measurement unit
30 phase image generating unit
40 evaluation unit
45 sorting unit
50 multiplier
60 divider
70 control device
80 measurement window control unit
100 component
110 gap
120 conductive track
130 conductive track
131 opening
C capacitance
D gap width
E electric field
EHG electron hologram
f excitation frequency
F measurement window
K constant
M measurement value
Max maximum
Min minimum
PB phase image
Se electron beam
Sr reference electron beam
ST(f) control signal
T period duration
Tf temporal length
U0 voltage amplitude
Ua component voltage
Ue excitation signal
Uoffset DC part
VG(f) frequency response
x position
φ phase
dφ/dx gradient value
Max(|dφ/dx|) maximum gradient value

The invention claimed is:

1. A method for recording a measurement value (dφ/dx, M), comprising the steps of:
    feeding a sinusoidal excitation signal (Ue) having a predetermined excitation frequency (f), with or without a superimposed DC part (Uoffset), to an input of a component (100, C),
    carrying out at least one electron holography measurement step, in which
        an electron beam (Se) is directed onto the component (100, C), passes through the component (100, C) and is subsequently superimposed with a reference electron beam (Sr), and
        an electron hologram (EHG) resulting from interference of the two electron beams (Se, Sr) during a predetermined measurement window (F) is measured, and a phase image (PB) is determined therefrom, and
    wherein the measurement value (M) is formed with the aid of the phase image (PB),
    wherein the temporal length (Tf) of the measurement window (F) of the electron holography measurement step is less than half the period duration (T) of the sinusoidal excitation signal (Ue).

2. The method as claimed in claim 1, wherein the location of the measurement window (F) relative to the points of maximum gradient of the excitation signal (Ue) is selected in such a way that the measurement window (F) lies between these points and does not include them.

3. The method as claimed in claim 1, wherein the location of the measurement window (F) is selected in such a way that it records an extremum, i.e. either a maximum (Max) or a minimum (Min), of the excitation signal (Ue).

4. The method as claimed in claim 1, wherein the location of the measurement window (F) is selected in such a way that the window center lies at or at least in the region of the extremum of the excitation signal (Ue).

5. The method as claimed in claim 1, wherein the method includes carrying out at least two electron holography measurement steps successively with different excitation frequencies (f).

6. The method as claimed in claim 5, wherein in each of the electron holography measurement steps, the length (Tf) of the measurement window (F) and the respective period length (T) of the sinusoidal excitation signal (Ue) are adapted to one another, specifically in such a way that the ratio between the length (Tf) of the measurement window (F) and the respective period length (T) of the excitation signal (Ue) is equally large for all electron holography measurement steps.

7. The method as claimed in claim 5, wherein in each of the electron holography measurement steps—independently of the respective excitation frequency (f)—the location of the measurement window (F) in relation to the time profile of the excitation signal (Ue) is always the same, and in particular the window center always lies at or at least in the region of the selected extremum of the excitation signal (Ue).

8. The method as claimed in claim 1, wherein the variation of the phase as a function of the position (x) is determined by forming a gradient value (dφ/dx) with the aid of the phase image (PB), and the gradient value (dφ/dx) is output as the measurement value (M) or the measurement value (M) is formed with the gradient value (dφ/dx), in particular by multiplication by a constant (K).

9. The method as claimed in claim 1, wherein the electrical voltage applied to the component (100, C) is determined as the measurement value (M).

10. The method as claimed in claim 1, wherein the current flowing through the component (100, C) is determined as the measurement value (M).

11. The method as claimed in claim 1, wherein the temporal length (Tf) of the measurement window (F) is less than one fifth of the period duration (T) of the excitation signal (Ue), in particular less than one eighth, preferably less than one tenth and particularly preferably less than one twentieth of the period duration (T) of the sine signal.

12. The method as claimed in claim 1, that wherein the temporal length (Tf) of the measurement window (F) lies in the range of between one twentieth and one hundredth of the period duration (T) of the sine signal.

13. The method as claimed in claim 1, wherein a multiplicity of electron holography measurement steps of the type described are carried out successively with different excitation frequencies (f) and in each electron holography measurement step, a ratio value between the amplitude (U0) of the AC part of the sinusoidal excitation signal (Ue) and the measurement value (M) is calculated in each case and a frequency response (VG(f)) of the component (100, C) is determined with the aid of the ratio values (V).

14. An arrangement for recording a measurement value (M), comprising a sine generator (10) configured to generate a sinusoidal excitation signal (Ue) having a predetermined excitation frequency (f), with or without a superimposed DC part (Uoffset), and wherein the singe generator is configured to feed the sinusoidal excitation signal into a component (100, C), an electron holography measuring instrument (20) for carrying out an electron holography measurement step, in which an electron beam (Se) is directed onto the component (100, C), passes through the component (100, C) and is subsequently superimposed with a reference electron beam (Sr), and an electron hologram (EHG) resulting from interference of the two electron beams during a predetermined measurement window (F) is measured, and a phase image (PB) is determined therefrom, an evaluation unit (40) for forming the measurement value with the aid of the phase image (PB), and a measurement window control unit (80) for determining the location and length (Tf) of the measurement window (F), specifically in such a way that the temporal length (Tf) of the measurement window (F) of the electron holography measurement step is less than half the period duration (T) of the sinusoidal excitation signal (Ue).

15. The arrangement as claimed in claim 14, wherein the measurement window control unit (80) is configured to select the location of the measurement window (F) relative to the points of maximum gradient of the excitation signal (Ue) so that the measurement window (F) lies between these points and does not include them.

16. The arrangement as claimed in claim 14, wherein
the measurement window control unit (80) is configured to select the location of the measurement window (F) so that the measurement window (F) records either a maximum (Max) or a minimum (Min), of the excitation signal (Ue).

17. The arrangement as claimed in claim 14, wherein
the measurement window control unit (80) is configured to select the location of the measurement window (F) so that the window center lies at or at least in the region of an extremum of the excitation signal (Ue).

18. The arrangement as claimed in claim 14, wherein
the measurement window control unit (80) is configured in such a way that, in the case of a plurality of electron holography measurement steps successively with different period lengths of the excitation signal (Ue), in each electron holography measurement step the length (Tf) of the measurement window (F) is respectively adapted to the respective period length (T) of the excitation signal (Ue), specifically in such a way that the ratio between the length (Tf) of the measurement window (F) and the respective period length (T) of the excitation signal (Ue) is equally large for all electron holography measurement steps.

19. The arrangement as claimed in claim 14, wherein the measurement window control unit (80) is configured in such a way that, in the case of a plurality of electron holography measurement steps successively with different period lengths of the excitation signal (Ue), in each electron holography measurement step said control unit respectively adapts the location of the measurement window (F) to the respective period length (T) of the excitation signal (Ue), specifically in such a way that the location of the measurement window (F) in relation to the time profile of the excitation signal (Ue), in particular relative to the extrema of the excitation signal (Ue), is the same for all electron holography measurement steps.

20. The arrangement as claimed in claim 14, wherein the evaluation unit (40) is configured to determine the variation of the phase ($\varphi$) as a function of the position (x) by forming a gradient value (d(p/dx) with the aid of the phase image (PB), and outputs outputting the gradient value (d$\varphi$/dx) as the measurement value (M) or forms the measurement value (M) with the gradient value (d$\varphi$/dx), in particular by multiplication by a constant (K).

* * * * *